(12) United States Patent
Gong et al.

(10) Patent No.: US 9,869,025 B2
(45) Date of Patent: Jan. 16, 2018

(54) DOPED TIN OXIDE AND METHOD FOR SELECTIVE METALLIZATION OF INSULATING SUBSTRATE

(71) Applicant: BYD COMPANY LIMITED, Shenzhen, Guangdong (CN)

(72) Inventors: Qing Gong, Guangdong (CN); Wei Zhou, Guangdong (CN); Weifeng Miao, Guangdong (CN)

(73) Assignee: BYD COMPANY LIMITED, Shenzhen (CN)

( * ) Notice: Subject to any disclaimer, the term of this patent is extended or adjusted under 35 U.S.C. 154(b) by 55 days.

(21) Appl. No.: 14/943,861

(22) Filed: Nov. 17, 2015

(65) Prior Publication Data
US 2016/0068964 A1    Mar. 10, 2016

Related U.S. Application Data

(63) Continuation of application No. PCT/CN2014/078305, filed on May 23, 2014.

(30) Foreign Application Priority Data

May 23, 2013 (CN) .......................... 2013 1 0195129
May 23, 2013 (CN) .......................... 2013 1 0196611

(51) Int. Cl.
| | | |
|---|---|---|
| C23C 18/38 | (2006.01) | |
| C01G 19/02 | (2006.01) | |
| C01G 31/00 | (2006.01) | |
| C08K 3/22 | (2006.01) | |
| C09D 11/03 | (2014.01) | |
| C23C 18/16 | (2006.01) | |
| H05K 1/03 | (2006.01) | |
| H05K 3/10 | (2006.01) | |
| H05K 3/18 | (2006.01) | |
| C23C 18/20 | (2006.01) | |
| B29C 37/00 | (2006.01) | |
| C23C 18/28 | (2006.01) | |
| C01G 19/00 | (2006.01) | |
| C01G 30/00 | (2006.01) | |
| C01G 39/00 | (2006.01) | |
| B29C 35/08 | (2006.01) | |

(52) U.S. Cl.
CPC ...... *C23C 18/1608* (2013.01); *B29C 37/0025* (2013.01); *C01G 19/006* (2013.01); *C01G 19/02* (2013.01); *C01G 30/002* (2013.01); *C01G 31/00* (2013.01); *C01G 39/00* (2013.01); *C08K 3/22* (2013.01); *C09D 11/03* (2013.01); *C23C 18/1612* (2013.01); *C23C 18/1641* (2013.01); *C23C 18/204* (2013.01); *C23C 18/285* (2013.01); *C23C 18/38* (2013.01); *H05K 1/0373* (2013.01); *H05K 3/107* (2013.01); *H05K 3/185* (2013.01); *B29C 2035/0838* (2013.01); *B29C 2035/0872* (2013.01); *B29C 2035/0877* (2013.01); *C01P 2002/50* (2013.01); *C01P 2002/52* (2013.01); *C01P 2004/61* (2013.01); *C01P 2004/62* (2013.01); *C01P 2004/64* (2013.01); *C08K 2003/2231* (2013.01); *C08K 2003/2255* (2013.01); *H05K 2201/0215* (2013.01); *H05K 2201/0218* (2013.01); *H05K 2201/0236* (2013.01); *H05K 2203/107* (2013.01)

(58) Field of Classification Search
None
See application file for complete search history.

(56) References Cited

U.S. PATENT DOCUMENTS

| 5,599,592 | A | 2/1997 | Laude | |
|---|---|---|---|---|
| 2007/0140891 | A1 | 6/2007 | Areva et al. | |
| 2010/0092700 | A1* | 4/2010 | Carroll ................. | B41M 5/267 427/597 |
| 2012/0276390 | A1 | 11/2012 | Ji et al. | |

FOREIGN PATENT DOCUMENTS

| CN | 1916057 A | 2/2007 |
|---|---|---|
| CN | 101200604 A | 6/2008 |
| CN | 101294928 A | 10/2008 |
| CN | 101550546 A | 10/2009 |
| CN | 101684551 A | 3/2010 |
| CN | 101845248 A | 9/2010 |
| CN | 102418091 A | 4/2012 |
| CN | 102675975 A | 9/2012 |
| CN | 103095866 A | 5/2013 |
| CN | 103757615 A | 4/2014 |

(Continued)

OTHER PUBLICATIONS

Bordoni et al., Nature of Vanadium Species in $Sno_2$-$V_2O_5$-based Catalysts. Chemistry of Preparation, Characterization, Thermal Stability and Reactivity in Ethane Oxidative Dehydrogenation over V—Sn Mixed Oxides, Journal Of The Chemical Society, Oct. 7, 1994, vol. 90, No. 19, p. 2981-3000.

Chiorino et al., Preparation and characterization of $SnO_2$ and $MoO_x$—$SnO_2$ nanosized powders for thick film gas sensors, Sensors and Actuators B, Jan. 13, 1999,vol. 58, p. 338-349.

International Search Report and Written Opinion for Application No. PCT/CN2014/078305, dated Sep. 1, 2014, 9 pages.

(Continued)

*Primary Examiner* — Sheeba Ahmed

(57) ABSTRACT

Embodiments of the present disclosure are directed to a doped tin oxide. The doped tin oxide includes a tin oxide and at least one oxide of a doping element. The doping element includes at least one of vanadium and molybdenum. The doped tin oxide includes an amount of the tin oxide ranging from 90 mol % to 99 mol %, and an amount of the at least one oxide ranging from 1 mol % to 10 mol %.

3 Claims, No Drawings

(56) References Cited

FOREIGN PATENT DOCUMENTS

EP 0711102 A1 5/1996
JP S 59-184847 A 10/1984

OTHER PUBLICATIONS

Lee et al., A novel tin oxide-based recoverable thick film $SO_2$ gas sensor promoted with magnesium and vanadium oxides, Sensors and Actuators B, Sep. 22, 2011, vol. 160, p. 1328-1334.
Orel et al., Preparation and Characterization of Mo- and Sb : Mo-doped $SnO_2$ Sol-Gel-derived Films for Counter-electrode Applications in Electrochromic Devices, Journal of Materials Chemistry, 1995, vol. 5, No. 4, p. 617-624.
Stjerna et al., Optical and electrical properties of sputter-deposited Mo-doped tin oxide thin films, Journal of Physics D: Applied Physics, Apr. 5, 1993, vol. 26, p. 1011-1012.
E. Bontempi et al., "Structural Characterization of Tin and Molybdenum Oxides Thin Films Deposited by RGTO", *Chem. Mater.*, vol. 13, No. 8, 2001, pp. 2608-2612.

\* cited by examiner

1

DOPED TIN OXIDE AND METHOD FOR SELECTIVE METALLIZATION OF INSULATING SUBSTRATE

CROSS-REFERENCE TO RELATED APPLICATIONS

This application is a continuation of International Application No. PCT/CN2014/078305, filed May 23, 2014, which claims priority to and benefits of Chinese Patent Applications No. 201310196611.3 and No. 201310195129.8, both filed with the State Intellectual Property Office of P. R. China on May 23, 2013. The entire contents of the above-referenced applications are incorporated herein by reference in their entirety.

FIELD

The present disclosure relates to a doped tin oxide and a method of preparing the doped tin oxide. The present disclosure also relates to a polymer article including the doped tin oxide, a method of preparing the polymer article, a method for selective metallization of a surface of the polymer article, an ink composition including the doped tin oxide, a method of preparing the ink composition, and a method for selective metallization of an insulating substrate.

BACKGROUND

Providing a metal layer on a selected area of a surface of a polymer substrate in order to form a passage for transmitting electro-magnetic signals is widely applied in the fields of automobile, computer, communications, etc. The metal layer can be formed on the surface of the polymer substrate in various ways.

For example, U.S. Pat. No. 5,599,592 discloses a metallization process for metallizing a plastic composite article containing a polymer and grains of one or more metal oxides. The method includes steps of: 1) irradiating the plastic article surface to be metallized with a light beam emitted by an excimer laser; 2) immersing the irradiated article into at least one autocatalytic bath; 3) thermally processing the metallized plastic article to induce the diffusion of the deposited metal into the plastic article. The metal oxides may be oxides of antimony, aluminum, iron, zinc, or tin. It is disclosed in U.S. Pat. No. 5,599,592 that the content of the grains of metal oxides in the plastic composite article can be in the range from 1% to 30% (by weight). However, as described in the specification of U.S. Pat. No. 5,599,592, the contents of the grains of the metal oxides in the plastic composite articles are all above 4% by volume.

SUMMARY

In accordance with one embodiment of the present disclosure, a doped tin oxide is provided. The doped tin oxide may include a tin oxide and an oxide of a doping element, and the doping element may include at least one of vanadium and molybdenum. In some embodiments, based on the total amount of the doped tin oxide, the tin oxide is about 90-99 mol %, and the oxide of the doping element is about 1-10 mol %.

According to embodiments of the present disclosure, the doped tin oxide has a light color. When the doped tin oxide is dispersed in a base polymer, it may not or may not substantially influence the color of the base polymer itself. In addition, the doped tin oxide has very strong adsorption power to an energy source, therefore a predetermined part of the base polymer may be removed by the irradiation of the energy source, even when the amount of the doped tin oxide is relatively low and/or when the energy of the energy source is very weak. In such embodiments, the impact of a high content of metal compound dispersed in the base polymer on the mechanical properties of the base polymer may be substantially limited or prevented. In some embodiments, the doped tin oxide may act as a chemical plating accelerator without being activated by the energy source, for example, without being reduced into pure metal. Then metals may be deposited on the doped tin oxide by chemical plating.

Embodiments of a second aspect of the present disclosure provide a method for preparing a doped tin oxide. The method may include steps of: providing a powder mixture including a tin oxide and at least one compound of a doping element, and sintering the powder mixture. In some embodiments, the doping element may include at least one of vanadium and molybdenum. In some embodiments, the compound may include at least one of an oxide of the doping element and a precursor capable of forming the oxide of the doping element under the sintering. In some embodiments, based on the total amount of the powder mixture, the tin oxide may be about 90-99 mol %, and the oxide of the doping element may be about 1-10 mol %.

Embodiments of a third aspect of the present disclosure provide a doped tin oxide obtained by the above-mentioned method. The doped tin oxide prepared according to the method may have the properties described above for the doped tin oxide.

Embodiments of a fourth aspect of the present disclosure provide a polymer article. The polymer article may include a base polymer and at least one metal compound dispersed in the base polymer, in which the metal compound may include or consist of the above-mentioned doped tin oxide.

Embodiments of a fifth aspect of the present disclosure provide a method for preparing a polymer article. The method may include steps of: providing a mixture including a base polymer and at least one metal compound described above, and molding the mixture.

Embodiments of a sixth aspect of the present disclosure provide a method for selective metallization of a surface of the polymer article. The method may include steps of: vaporizing at least a part of the surface of the polymer article by irradiating the surface with an energy source; and forming at least one metal layer on the surface of the polymer article by chemical plating.

According to embodiments of the present disclosure, the metal compound, which may include the doped tin oxide, may act as an accelerator for chemical plating without being reduced to pure metal. In some embodiments, the polymer article may be subjected to some simple surface treatments, e.g. surface roughening, so that selective metallization on the surface of the polymer article may be achieved. In some embodiments, the surface roughening may be performed by irradiating the surface of the polymer article with a laser. The energy of the laser needs to be sufficient for removing the predetermined part of the polymer article and thus exposing the metal compound in the predetermined part, and the energy of the laser may not need to be extremely high in order to reduce the metal compound into pure metal. When the metal compound is exposed, the following step of chemical plating may be performed directly on the irradiated part of the surface of the polymer article. The method for selective metallization of the polymer article is relatively simple and has low requirement on the energy of the energy source, and is therefore suitable for large scale applications.

Embodiments of a seventh aspect of the present disclosure provide an ink composition. The ink composition may include a binder and at least one metal compound dispersed in the binder, in which the metal compound may include or consist of the doped tin oxide.

Embodiments of an eighth aspect of the present disclosure provide a method for selective metallization of a surface of an insulating substrate. The method may include steps of: forming an ink layer on the surface of the insulating substrate by providing the ink composition on the surface of the insulating substrate, and forming at least one metal layer on the ink layer by chemical plating.

According to embodiments of the present disclosure, the metal compound, which may include the doped tin oxide, may act as an accelerator for chemical plating without being reduced to pure metal. In some embodiments, the ink layer may be subjected to some treatments, e.g. irradiation of a predetermined part of the ink layer with laser, so that selective metallization on the ink layer may be achieved. In some embodiments, the ink layer including the metal compound may be plated with a metal layer even without the irradiation by the energy source. The energy of the energy source, such as a laser, needs to be sufficient for removing the predetermined part of the ink layer and exposing the metal compound in the predetermined part, and the energy of the laser may not need to be extremely high in order to reduce the metal compound into pure metal. When the metal compound is exposed, the following chemical plating may be performed directly on the irradiated part of the ink layer. As the ink layer is applied on the insulating substrate, the selective metallization of the insulating substrate may be achieved. The method for selective metallization of the insulating substrate is relatively simple and has low requirement on the energy of the energy source, and is therefore suitable for large scale applications.

Additional aspects and advantages of embodiments of present disclosure will be given in part in the following descriptions, become apparent in part from the following descriptions, or be learned from the practice of the embodiments of the present disclosure.

DETAILED DESCRIPTION

Reference will be made in detail to embodiments of the present disclosure. The embodiments described herein with reference to examples and tables are explanatory, illustrative, and used to generally understand the present disclosure. The embodiments shall not be construed to limit the present disclosure.

In addition, terms, such as "first" and "second," are used herein for purposes of description and are not intended to indicate or imply relative importance or significance.

For the purpose of the present description and of the following claims, the definitions of the numerical ranges always include the extremes unless otherwise specified.

According to a first aspect of embodiments of the present disclosure, a doped tin oxide is provided. The doped tin oxide may include a tin oxide and an oxide of a doping element. The doping element may include at least one of vanadium and molybdenum. In some embodiments, based on the total amount of the doped tin oxide (for example, the sum of amounts of the tin oxide and the oxide of the doping element), the content of the tin oxide is about 90-99 mol %, and the content of the oxide of the doping element is about 1-10 mol %.

In some embodiments, the amount of the doping element is about 1 mol % to about 10 mol %, and the amount of the doping element is obtained by the following formula:

molar amount of the oxide of the doping element/(molar amount of the oxide of the doping element+molar amount of the tin oxide).

In some embodiments, the tin oxide is about 92-98 mol %, and the oxide of the doping element is about 2-8 mol %.

There are no particular limits to the ratio between the doping elements, such as vanadium to molybdenum, in the present disclosure, provided the total amount of vanadium and/or molybdenum satisfies the content of the doping element.

The diameter of the doped tin oxide particles may be selected properly according to practical requirements. In some embodiments, the doped tin oxide particles have an average volume diameter of about 50 nm to about 10 μm. In some embodiments, the doped tin oxide particles have an average volume diameter of about 300 nm to about 5 μm. In some embodiments, the doped tin oxide particles have an average volume diameter of about 1 μm to about 3.5 μm. The average volume diameter may be determined by any suitable conventional method, for example, measured by a laser particle analyzer.

The doped tin oxide according to embodiments of the present disclosure has a light color, which is generally white.

In some embodiments, the doped tin oxide may be prepared by using at least one oxide of vanadium (V) and molybdenum (Mo) as the doping material. The oxide of V may refer to a compound formed by elements V and oxygen (O), which generally refers to $V_2O_5$. The oxide of Mo may refer to a compound formed by elements Mo and oxygen (O), which generally refers to $MoO_3$.

According to a second aspect of embodiments of the present disclosure, a method for preparing a doped tin oxide is provided. The method includes steps of: providing a powder mixture including a tin oxide and at least one compound of a doping element, and sintering the powder mixture.

In some embodiments, the doping element includes at least one of vanadium and molybdenum. In some embodiments, the doping element includes V, and the oxide of the doping element includes $V_2O_5$. In some embodiments, the doping element includes Mo, and the oxide of the doping element includes $MoO_3$.

In some embodiments, the compound may include at least one of an oxide of the doping element and a precursor capable of forming the oxide of the doping element under the sintering. In some embodiments, the doping element includes V, and the precursor capable of forming the oxide of the doping element under the sintering includes at least one of a V hydroxide and a V gel. In some embodiments, the doping element includes Mo, and the precursor capable of forming the oxide of the doping element under the sintering includes at least one of a Mo hydroxide and a Mo gel.

In some embodiments, based on the total amount of the powder mixture (for example, the sum of amounts of the tin oxide and the oxide of the doping element), the tin oxide is about 90-99 mol %, and the oxide of the doping element is about 1-10 mol %.

In some embodiments, the amount of the doping element is about 1 mol % to about 10 mol %, and the amount of the doping element is obtained by the following formula:

molar amount of the oxide of the doping element/(molar amount of the oxide of the doping element+molar amount of the tin oxide).

In some embodiments, the tin oxide is about 92-98 mol %, and the oxide of the doping element is about 2-8 mol %.

In some embodiments, the content of the doping element may refer to the amount of the doping element present in the form of oxide, in case the compound is the oxide of the doping element. In other embodiments, the content of the doping element may refer to the amount of an oxide that corresponds to the amount of the precursor, in case the compound is the precursor capable of forming the oxide of the doping element under the sintering. There are no particular limits to the ratio between the doping elements, such as vanadium to molybdenum, in the present disclosure, provided the total amount of vanadium and/or molybdenum satisfies the content of the doping element.

There are no special limits for the method for preparing the powder mixture, which may be any suitable option in the related art. In some embodiments, the powders may be obtained by grinding the tin oxide and the metal compound including the doping element. The grinding may be performed by a dry grinding process, a wet grinding process, or a semi-dry grinding process.

In some embodiments, the wet grinding process may be carried out using a dispersant. The dispersant may be any normally used dispersant in a conventional grinding process. In some embodiments, the dispersant may be water and/or a $C_1$-$C_5$ alcohol, for example, ethanol. The amount of the dispersant is known in the art, without special limits.

In some embodiments, the powders may be obtained by a wet grinding process or a semi-dry grinding process. And the wet grinding process and the semi-dry grinding process may further include a drying step. The drying may be carried out by a normal drying process. In some embodiments, the drying is carried out at a temperature ranging from about 40° C. to about 120° C. In some embodiments, the drying may be carried out under an atmosphere including oxygen, or under a non-reactive atmosphere. The atmosphere including oxygen may be air or a combination of oxygen and a non-reactive gas. The non-reactive gas may refer to any gas that may not react chemically with the components of the powders or the prepared metal compound. For example, the non-reactive gas may be those selected from group 0 of the periodic table or nitrogen. In some embodiment, the non-reactive gas may be argon.

There are no special limits to the diameter of the powder mixture in the present disclosure, which may be any suitable option in the art. In some embodiments, particles in the powder mixture have an average volume diameter of about 50 nm to about 10 μm.

In some embodiments, the sintering may be conducted at a temperature ranging from about 800° C. to about 1000° C. In some embodiments, the sintering may be conducted at a temperature ranging from about 850° C. to about 950° C. The condition for sintering may be selected according to the sintering temperature, and the sintering may be performed for a time period ranging from about 1 hour to 6 hours.

In some embodiments, the sintering may be carried out under an atmosphere including oxygen. In some embodiments, the sintering may be carried out under a non-reactive atmosphere. In an embodiment, the compound including the doping element is the precursor capable of forming the oxide under the sintering, and the sintering is performed under the atmosphere including oxygen.

In some embodiments, the method further includes a step of grinding a solid product obtained from the sintering step in order to provide the final product with more desired properties. In some embodiments, the particles of a grinded product obtained from the grinding step may have an average volume diameter ranging from about 50 nm to about 10 μm. In some embodiments, the particles of the grinded product may have an average volume diameter ranging from about 300 nm to about 5 μm. In some embodiments, the particles of the grinded product may have an average volume diameter ranging from about 1 μm to about 3.5 μm. Further grinding may be performed by at least one process selected from a group including: dry grinding process, wet grinding process, and semi-dry grinding process, which are known in the art and have been described in the above.

According to a third aspect of embodiments of the present disclosure, a doped tin oxide obtained by the above-described method is provided. The doped tin oxide prepared may have the properties described above for the doped tin oxide.

According to a fourth aspect of embodiments of the present disclosure, a polymer article is provided. The polymer article includes a base polymer, and at least one metal compound dispersed in the base polymer, in which the metal compound includes or consists of the above-described doped tin oxide.

There are no special limits to the content of the metal compound in the polymer article, which may be properly selected according to required properties and/functions. In some embodiments, based on the total weight of the polymer article, the content of the metal compound is about 1-3 wt %, and the content of the base polymer is about 97-99 wt %. In some embodiments, based on the total weight of the polymer article, the content of the metal compound is about 1-5 wt %, and the content of the base polymer is about 95-99 wt %.

According to embodiments of the present disclosure, the metal compound provides the doped tin oxide for the polymer article. The doped tin oxide has a stronger energy absorption capability to the energy source, and may absorb enough energy to vaporize the predetermined part of the surface of the polymer article and expose the metal compound in the predetermined part, even when the amount of the metal compound in the polymer article is relatively low. For example, in some embodiments, the content of the metal compound is about 1-3 wt %. With this amount of metal compound, the polymer article may have improved mechanical performances and/properties, such as a higher impact strength.

In some embodiments, the base polymer may be any suitably moulded polymers, and may be chosen according to practical use. In some embodiments, the base polymer may be a thermoplastic polymer or a thermosetting polymer. In some embodiments, the base polymer may be at least one selected from a group including: plastic, rubber, and fiber.

By way of example and without limiting the present disclosure, in some embodiments, the polymer may be at least one selected from a group including: polyolefin, such as polystyrene, polypropylene, poly(methyl methacrylate) and poly(acrylonitrile-butadiene-styrene); polycarbonate; polyester, such as poly(cyclohexylene dimethylene terephthalate), poly(diallyl isophthalate), poly(diallyl terephthalate), poly(butylene naphthalate), poly(ethylene terephthalate) and poly(butylene terephthalate); polyamide, such as poly(hexamethylene adipamide), poly(hexamethylene azelamide), poly(hexamethylene succinamide), poly(hexamethylene lauramide), poly(hexamethylene sebacamide), poly(decamethylene sebacamide), polyundecanamide, poly(lauramide), poly(octanamide), poly(9-amino nonanoic acid), polycaprolactam, poly(phenylene terephthamide), poly(hexylene isophthalamide), poly(hexylene terephthamide) and poly(nonylene terephthamide); poly(aromatic ether); polyether imide;

polycarbonate/(acrylonitrile-butadiene-styrene) alloy; polyphenylene oxide; polyphenylene sulfide; polyimide; polysulfone; poly(ether-ether-ketone); polybenzimidazole; phenol formaldehyde resin; urea formaldehyde resin; melamine-formaldehyde resin; epoxide resin; alkyd resin; and polyurethane.

In some embodiments, the polymer article may further include at least one additive. In some embodiments, the additive can be, for example, a filler, an antioxidant, and a light stabilizer. By the addition of the additive, the performance and property of the polymer article may be improved. There are no special limits for the content and the type of the additive, provided the colour of the additive is light. The additive may be selected according to, for example, practical requirements.

The filler used as the additive to the polymer article may be any suitable filler that is non-reactive under the effect of laser (either physically or chemically). In some embodiments, the filler may be at least one selected from talc and/or calcium carbonate.

In some embodiments, the filler may be a glass fiber. With the addition of a glass fiber, the thickness of the removed base polymer (i.e., the distance from the top surface of the polymer article to the exposed metal compound) may be significantly increased, which may facilitate the deposition of metal onto the metal compound during the following chemical plating process.

The filler may be any suitable inorganic filler. In some embodiments, the filler may be selected from micro glass bead, calcium sulfate, barium sulfate, titanium dioxide, pearl powder, wollastonite, diatomite, caoline, coal fines, pot clay, mica, oil shale ash, aluminum silicate, alumina, silica, and zinc oxide.

The antioxidant used as the additive to the polymer article may be any suitable antioxidant in the related art. In some embodiments, the antioxidant may include a primary antioxidant and a secondary antioxidant. The ratio between the primary antioxidant and the secondary antioxidant may be appropriately selected according to, for example, the type of the antioxidant. In some embodiments, the weight ratio between the primary antioxidant and the secondary antioxidant may be about 1:1-4.

In some embodiments, the primary antioxidant may be a hindered phenol antioxidant. By way of example but without limiting, in some embodiments, the primary antioxidant may be antioxidant 1098 or antioxidant 1010, in which the antioxidant 1098 mainly includes N,N'-bis-(3-(3,5-di-tert-butyl-4-hydroxyphenyl)propionyl) hexane diamine, and the antioxidant 1010 mainly includes tetra[3-(3,5-di-tert-butyl-4-hydroxyphenyl)propionic acid]pentaerythritol.

In some embodiments, the secondary antioxidant may be a phosphite ester antioxidant. By way of example and without limits, in some embodiments, the secondary antioxidant may be antioxidant 168, which mainly includes tri(2,4-di-tert-butyl-phenyl)phosphorite.

In some embodiments, the light stabilizer used as the additive to the polymer article may be of the hindered amine type. In some embodiments, the light stabilizer may be bis(2,2,6,6-tetramethyl-4-piperidyl)sebacate. The light stabilizer may be any known ones in the art, without special limits in the present disclosure.

In some embodiments, the amount of the additive may be appropriately selected according to functions and types of the additives. In some embodiments, based on 100 weight parts of the polymer article, the content of the filler may range from 1 weight part to 40 weight parts, the content of the antioxidant may range from about 0.01 weight parts to about 1 weight parts, the content of the light stabilizer may range from about 0.01 weight parts to about 1 weight part, and the content of the lubricant may range from about 0.01 weight parts to about 1 weight part, for example.

According to a fifth aspect of embodiments of the present disclosure, a method for preparing a polymer article is provided. The method includes steps of: providing a mixture including a base polymer and at least one metal compound, and molding the mixture, in which the metal compound includes or consists of the above-described doped tin oxide.

In some embodiments, based on the total weight of the polymer article, the content of the metal compound is about 1-3 wt %, and the content of the base polymer is about 97-99 wt %.

The base polymer may refer to the polymers described above, including at least one of the various additives described above. In some embodiments, the above-described additive may be used to improve the performance of the base polymer and provide the base polymer with a new property. In some embodiments, the base polymer may further include an additive for improving the processing performance and/or property of the base polymer, such as a lubricant.

In some embodiments, the lubricant may be at least one selected from a group including: ethylene/vinyl acetate copolymer (EVA wax), polyethylene (PE wax), and stearate. With the addition of the lubricant, a flowing property and/or performance of the polymer article may be improved.

In some embodiments, the molding step may be performed by any conventional molding process known in the art, without special limits in the present disclosure. In some embodiments, the molding step is performed by injection molding. In other embodiments, the molding step is performed by extrusion molding.

According to a sixth aspect of embodiments of the present disclosure, a method for selective metallization of a surface of a polymer article is provided. The polymer article is described above. The method includes steps of: vaporizing at least a part of the surface of the polymer article by irradiating the surface with an energy source; and forming at least one metal layer on the surface of the polymer article by chemical plating.

According to embodiments of the present disclosure, the base polymer in a predetermined part of the surface of the polymer article may be removed and the metal compound in the predetermined part may be exposed by the irradiating step, without reducing the metal compound into pure metal. In the following chemical plating step, metals may be deposited on the metal compound in the predetermined part of the polymer article, by which at least one metal layer may be formed on the predetermined part of the polymer article. In such embodiments, selective metallization of the polymer article may be achieved.

In some embodiments, the energy source may be at least one selected from a group including: a laser, an electron beam, and an ion beam. In some embodiments, the energy source is a laser. The energy provided by the laser allows the base polymer in the irradiated area of the surface of the polymer article to be vaporized and the metal compound in the irradiated area to be exposed. The metal compound has a substantial absorption capability to the energy provided by the energy source, such that the base polymer in the predetermined part of the polymer article may be removed and the metal compound in the predetermined part may be exposed, even when the energy source provides a relatively lower energy.

In some embodiments, the irradiating step may be performed by using a laser, and the laser may have a wavelength selected from 157-10600 nm and a power selected from 1-100 W. In one embodiment, the laser may have a wavelength selected from 1064-10600 nm and a power selected from 3-50 W. In another embodiment, the laser may have a wavelength selected from 1064 nm and a power selected from 3-40 W. In another embodiment, the laser may have a wavelength selected from 1064 nm and a power selected from 5-20 W. The predetermined part of the surface of the polymer article may form a pattern, and the metal layer then formed on the predetermined part may form a metal pattern on the polymer article. By using the laser, the precision of the metal pattern may be improved.

In some embodiments, the irradiating step may be performed by using an electron beam, and the electron beam may have a power density selected from $10\text{-}10^{11}$ $W/cm^2$.

In some embodiments, the irradiating step may be performed by using an ion beam, and the ion beam may have an energy selected from $10\text{-}10^6$ eV.

In some embodiments, the chemical plating may be carried out with the following steps. The polymer article subjected to the irradiation is immersed in a Cu solution. In some embodiments, the Cu solution may include a Cu salt. In some embodiments, the Cu solution may further include a reducing agent. In some embodiments, the Cu solution may have a pH ranging from about 12 to about 13. In some embodiments, the reducing agent may reduce the Cu ions in the Cu salt into Cu metal. In some embodiments, the reducing agent may be at least one selected from a group including: glyoxylic acid, diamide, and sodium phosphorate.

In some embodiments, the method may further include a step of electroplating or chemical plating. The electroplating or chemical plating may be performed at least once, so that one or more additional metal layers, either of the same metal as or of different metals from the prior metal layers, may be formed on the prior metal layers. In some embodiments, a Cu layer is formed on the surface of the polymer article in the first chemical plating step, and then a Ni layer is formed on the Cu layer in a following electroplating or chemical plating step. With the additional Ni layer, oxidation of the Cu layer may be reduced and/or prevented.

According to a seventh aspect of embodiments of the present disclosure, an ink composition is provided. The ink composition includes a binder and at least one metal compound dispersed in the binder, in which the metal compound includes or consists of the above-described doped tin oxide.

According to embodiments of the present disclosure, when the ink composition is applied on a surface of an insulating substrate, the binder may contribute to the uniform dispersion of the metal compound on the surface of the insulating substrate. In some embodiments, with the binder, an ink layer, which may contain the binder and the ink composition, may be formed on the surface of the insulating substrate. In some embodiments, the ink layer with the binder material can have certain required strength, which allows strong adhesion between the ink layer and the insulating substrate.

There are no specific limits for the binder, provided the above requirements are satisfied. In some embodiments, the binder is an organic binder.

In some embodiments, the binder may be at least one selected from a group including: cellulose acetate, polyacrylate resin, ethylene-vinyl acetate copolymer, polyvinyl alcohol, polyvinyl acetal, polyvinyl acetate, polyvinyl pyrrolidone, and polyphosphonic acid.

There are no specific limits for the binder in the present disclosure. In some embodiments, a commercially available binder may be used. In some embodiments, the binder is at least one selected from a group including: butyl acetate cellulose of CAB series commercially available from Eastman Chemical Company, US, such as butyl acetate cellulose No. CAB381-0.5, butyl acetate cellulose No. CAB381-20, butyl acetate cellulose No. CAB551-0.2, and butyl acetate cellulose No. CAB381-2; and polyvinyl butyral of Mowital series commercially from Kuraray Company, JP, such as polyvinyl butyral No. Mowital B 60T, polyvinyl butyral No. Mowital B 75H, and polyvinyl butyral No. Mowital B 60H.

There are no specific limits for the ratio between the binder and the metal compound in the ink composition, provided the metal compound may be dispersed uniformly on the surface of the insulating substrate. In some embodiments, the ink layer has a suitable amount of strength and a suitable amount of adhesion to the insulating substrate, and at least one metal layer may be formed on the ink layer. In some embodiments, based on 100 weight parts of the metal compound, the amount of the binder may range from about 1 weight part to about 60 weight parts. In some embodiments, the amount of the binder may range from about 30 weight parts to about 60 weight parts.

In some embodiments, the ink composition may further include a solvent. With the solvent, the metal compound may be dispersed in the binder more uniformly, and a more uniform ink layer may be formed on the surface of the insulating substrate.

The solvent may be any suitable one. In some embodiments, the solvent may be at least one selected from a group including: water, $C_1$-$C_{12}$ alcohol, $C_3$-$C_{12}$ ketone, $C_6$-$C_{12}$ aromatic hydrocarbon, $C_1$-$C_{12}$ alkyl halide, and $C_2$-$C_{12}$ alkenyl halide.

In some embodiments, the solvent may be at least one selected from a group including: methanol, ethanol, n-propanol, iso-propanol, n-butanol, tert-butanol, n-pentanol, n-hexanol, n-heptanol, n-octanol, acetone, 2-n-pentanone, 2-n-butanone, 3-methyl-2-pentanone, 2,3-butanedione, 2,3-pentanedione, 2,5-hexanedione, 1,3-cyclohexanedione, toluene, xylene, and trichloroethylene.

There are no specific limits for the amount of solvent in the ink composition. In some embodiments, an amount of solvent is added to disperse the metal compound uniformly in the binder and to form a uniform ink layer on the surface of the insulating substrate. In some embodiments, based on 100 weight parts of the metal compound, the amount of the solvent may range from about 20 weight parts to about 250 weight parts.

In some embodiments, the ink composition may further include an additive. The additive may be selected according to, for example, its specific performance, properties, or functions. In some embodiments, the additive may be at least one selected from a group including: a dispersant, an antifoaming agent, a leveling agent, and a viscosity regulator.

The content of the additive may be selected according to, for example, practical applications. In some embodiments, based on 100 weight parts of the metal compound, the amount of the additive may range from about 0.1 weigh part to about 20 weight parts. In some embodiments, the amount of the additive may range from about 0.5 weigh parts to about 10 weight parts.

According to some embodiments of the present disclosure, with the dispersant, the time that the metal compound needs to disperse uniformly in the binder and the optional solvent may be reduced, and the stability of the metal compound may be improved. The dispersant may be any suitable substance that is capable of providing the above functions. In some embodiments, the dispersant may be an organic dispersant.

In some embodiments, the organic dispersant may be at least one selected from a group including: aliphatic amine type dispersant, hydramine type dispersant, cyclic unsaturated amine type dispersant, fatty acid type dispersant, aliphatic amide type dispersant, ester type dispersant, paraffin type dispersant, phosphate type dispersant, polymer type dispersant (such as polyacrylate type dispersant or polyester type dispersant), and organic phosphine type dispersant.

In some embodiments, the dispersant may be any conventional one that is commercially available. In some embodiments, the dispersant may be at least one selected from a group including: dispersants with the following Nos. commercially available from BYK company, GE: ANTI-TERRA-U, ANTI-TERRA-U 80, ANTI-TERRA-U 100, DISPERBYK-101, DISPERBYK-130, BYK-220 S, LACTIMON, LACTIMON-WS, BYK-W 966, DISPERBYK, BYK-154, BYK-9076, DISPERBYK-108, DISPERBYK-109, DISPERBYK-110, DISPERBYK-102, DISPERBYK-111, DISPERBYK-180, DISPERBYK-106, DISPERBYK-187, DISPERBYK-181, DISPERBYK-140, DISPERBYK-142, DISPERBYK-145, DISPERBYK-115, DISPERBYK-160, DISPERBYK-161, DISPERBYK-162, DISPERBYK-163, DISPERBYK-164, DISPERBYK-165, DISPERBYK-166, DISPERBYK-167, DISPERBYK-182, DISPERBYK-183, DISPERBYK-184, DISPERBYK-185, DISPERBYK-168, DISPERBYK-169, DISPERBYK-170, DISPERBYK-171, DISPERBYK-174, DISPERBYK-190, DISPERBYK-2150, BYK-9077, DISPERBYK-112, DISPERBYK-116, DISPERBYK-191, DISPERBYK-192, DISPERBYK-2000, DISPERBYK-2001, DISPERBYK-2010, DISPERBYK-2020, DISPERBYK-2025, DISPERBYK-2050, and DISPERBYK-2070; dispersant No. PHOSPHOLAN PS-236 commercially available from Akzo Nobel Company, DL; dispersant No. PS-21A commercially available from Witco Chemical Company, US; and dispersants Serial Nos. Hypermer KD and Zephrym PD commercially available from Croda Company, GB.

The content of the dispersant may be determined based on any suitable operation in the related art. In some embodiments, based on 100 weight parts of the metal compound, the amount of the dispersant may range from about 0.1 weight part to about 4 weight parts.

The antifoaming agent may be any conventional one capable of preventing the formation of foams, and/or destroying formed foams or removing the formed foams from the ink composition. In some embodiments, the antifoaming agent may be at least one selected from a group including: organic polysiloxane type antifoaming agent, polyether type antifoaming agent, and fatty alcohol type antifoaming agent. In some embodiments, the antifoaming agent belongs to the organic polysiloxane series.

The antifoaming agent may be any suitable one or any conventional one that is commercially available. In some embodiments, the antifoaming agent may be at least one selected from a group including: antifoaming agents having the following Nos. commercially available from BYK Company, GE: BYK-051, BYK-052, BYK-053, BYK-055, BYK-057, BYK-020, BYK-065, BYK-066N, BYK-067A, BYK-070, BYK-080A, BYK-088, BYK-141, BYK-019, BYK-021, BYK-022, BYK-023, BYK-024, BYK-025, BYK-028, BYK-011, BYK-031, BYK-032, BYK-033, BYK-034, BYK-035, BYK-036, BYK-037, BYK-038, BYK-045, BYK-A530, BYK-A555, BYK-071, BYK-060, BYK-018, BYK-044, and BYK-094.

The amount of the antifoaming agent in the ink composition may be any suitable amount. In some embodiments, based on 100 weight parts of the metal compound, the amount of the antifoaming agent may range from about 0.01 weight part to about 3 weight parts.

According to embodiments of the present disclosure, with the addition of a leveling agent, the ink layer formed on the surface of the insulating substrate may be more flat and may become smoother. There are no specific limits for the leveling agent in the present disclosure, and the leveling agent may be any conventional one that is capable of performing the above functions. In some embodiments, the leveling agent may be at least one selected from a group including: polyacrylate series, polydimethylsiloxane series, polymethylphenylsiloxane series, and fluorine-containing surfactant.

The leveling agent may be any suitable one or any conventional one that is commercially available. In some embodiments, the leveling agent may be at least one selected from a group including: leveling agents having the following Nos. commercially available from BYK Company, GE: BYK-333, BYK-306, BYK-358N, BYK-310, BYK-354, and BYK-356.

The amount of the leveling agent in the ink composition may be any suitable amount. In some embodiments, based on 100 weight parts of the metal compound, the amount of the leveling agent may range from about 0.3 weight parts to about 4 weight parts.

According to embodiments of the present disclosure, with the addition of a viscosity regulator, the viscosity of the ink composition may be adjusted, depending on the practical requirements. There are no specific limits for the viscosity regulator in the present disclosure, and the viscosity regulator may be any suitable one or conventional one. In some embodiments, the viscosity regulator may be at least one selected from a group including: gaseous silica, polyamide wax, organic bentonite, hydrogenated castor oil, metallic soap, hydroxyl alkyl cellulose and derivatives thereof, polyvinyl alcohol, and polyacrylate.

The amount of the viscosity regulator in the ink composition may be any suitable amount. In some embodiments, based on 100 weight parts of the metal compound, the amount of the viscosity regulator may range from about 0.3 weight parts to about 3 weight parts.

In some embodiments, the ink composition includes, or alternatively consists of, the metal compound, the binder, the solvent, the dispersant, the antifoaming agent, the leveling agent and/or the viscosity regulator. Based on 100 weight parts of the metal compound, the amount of the binder ranges from about 1 weight part to about 60 weight parts. In some embodiments, the amount of the solvent ranges from about 20 weight parts to about 250 weight parts. In some embodiments, the amount of the dispersant ranges from about 0.4 weight parts to about 4 weight parts. In some embodiments, the amount of the antifoaming agent ranges from about 0.1 weight part to about 3 weight parts. In some embodiments, the amount of the leveling agent ranges from about 0.3 weight parts to about 4 weight parts. In some embodiments, the amount of the viscosity regulator ranges from about 0.3 weight parts to about 3 weight parts.

There are no specific limits for the preparing method of the ink composition in the present disclosure, provided the metal compound, the binder, and the optional additive are mixed uniformly. In some embodiments, the method for preparing the ink composition includes the following steps.

The metal compound, the binder, and the optional solvent and additive are mixed to form a first mixture. Then the first mixture is grinded in a mixer, which can be, for example, a planetary ball mill, to obtain the ink composition. Mixing and grinding in the planetary ball mill, as well as operation steps and conditions for the mixing and grinding, are well known to a person having ordinary skill in the art, thus details thereof are omitted.

According to embodiments of the present disclosure, by applying the ink composition on the surface of the insulating substrate, which can be non-conductive for, for example, electricity, and followed by chemical plating on the insulating substrate, selective metallization of the surface of the insulating substrate may be achieved. In some embodiments, when applying the ink composition on the surface of the insulating substrate to form the ink layer, the metal compound is dispersed in a predetermined part of the ink layer, or on a predetermined part of the surface of the insulating substrate. Then with the following chemical plating, metals may be deposited on the predetermined part of the insulating substrate, thereby at least one metal layer may be formed on the predetermined part of the insulating substrate. In this way, the selective metallization of the surface of the insulating substrate can be achieved.

According to an eighth aspect of embodiments of the present disclosure, a method for selective metallization of a surface of an insulating substrate is provided. The ink composition is described above. The method includes forming an ink layer on a surface of an insulating substrate by providing the above-described ink composition on the surface of the insulating substrate, and forming at least one metal layer on the ink layer by chemical plating.

According to embodiments of the present disclosure, the ink composition may be applied on a predetermined part of the surface of the insulating substrate, while the remaining of the surface of the insulating substrate is not covered with the ink composition. Therefore, the ink layer is only formed in the predetermined part of the surface of the insulating substrate. As the ink layer including the metal compound is conductive, by performing the chemical plating on the insulating substrate, at least one metal layer may be formed on a portion of the ink layer, for example, on the predetermined part of the surface of the insulating substrate, and the metal layer may not be deposited on the remaining area of the surface of the substrate. In this way, selective metallization of the surface of the insulating substrate can be achieved.

Various commonly used processes may be used for providing the ink composition according to embodiments of the present disclosure on the insulating substrate, for example, a process selected from a group including: screen printing, spray coating, laser printing, ink jet printing, pad printing, gravure printing, letterpress printing, and lithographic printing, can be used. Specific operating steps and conditions of screen printing, spray coating, laser printing, ink jet printing, pad printing, gravure printing, letterpress printing, and lithographic printing are well known to a person with ordinary skill in the art, so a detailed description thereof is omitted here for the clarity purpose. In some embodiments, the ink composition is applied on the surface of the insulating substrate by ink jet printing or laser printing.

In some embodiments, the method may further include a step of drying the ink layer.

The drying may be selected based on the binder material and the optional solvent in the ink composition. In some embodiments, the drying may be carried out at a temperature ranging from about 40° C. to about 150° C. In some embodiments, the drying can be carried out for an amount of time ranging from about 0.5 hours to about 5 hours. In some embodiments, the drying may be performed under a normal pressure. In some embodiments, the drying may be performed under a decreased pressure.

There are no specific limits for the thickness of the ink layer in the present disclosure, provided that the following chemical plating is capable of performing the selective metallization on the surface of the insulating substrate. In some embodiments, the ink layer has a thickness ranging from about 8 μm to about 50 μm. In some embodiments, the ink layer has a thickness ranging from about 12 μm to about 40 μm. In some embodiments, the ink layer has a thickness ranging from about 12 μm to about 25 μm.

In some embodiments, the chemical plating may be carried out with the following steps. The insulating substrate applied with the ink layer is immersed in a Cu solution. In some embodiments, the Cu solution may include a Cu salt. In some embodiments, the Cu solution may further include a reducing agent. In some embodiments, the Cu solution may have a pH ranging from about 12 to about 13. In some embodiments, the reducing agent may reduce the Cu ions in the Cu salt into Cu metal. In some embodiments, the reducing agent may be at least one selected from a group including: glyoxylic acid, diamide, and sodium phosphorate.

In some embodiments, the method may further include a step of electroplating or chemical plating. The electroplating or chemical plating may be performed for at least once, so that one or more additional metal layers, either of the same metal as or of different metals from the prior metal layers, may be formed on the prior metal layers. In some embodiments, a Cu layer is formed on the surface of the insulating substrate in the first chemical plating step, and then a Ni layer is formed on the Cu layer in a following electroplating or chemical plating step. With the additional Ni layer, oxidation of the Cu layer may be reduced and/or prevented.

In some embodiments, the method further includes vaporizing at least a part of a surface of the ink layer by irradiating the surface of the ink layer with an energy source, before the step of chemical plating. With the irradiating step, a predetermined part of the ink layer may be removed and the metal compound of the ink composition in this part may be exposed. Then the metal layer may be formed on the predetermined part in the following plating step. By subjecting the ink layer applied on the surface of the insulating substrate to irradiation, the metal layer formed in the subsequent chemical plating step may have a better adhesion to the insulating substrate.

In some embodiments, the energy source may be at least one selected from a group including: a laser, an electron beam, and an ion beam. In one embodiment, the energy source is a laser. The energy provided by the laser allows the ink layer in the irradiated area of the surface of the polymer article to be vaporized and the metal compound in the irradiated area to be exposed. The metal compound has an substantial absorption capability to the energy provided by the energy source, such that the ink layer in the predetermined part may be removed and the metal compound in the predetermined part may be exposed, even when the energy source provides a relatively lower energy.

In some embodiments, the irradiating step may be performed using a laser, and the laser may have a wavelength selected from 157-10600 nm and a power selected from 5-100 W. In one embodiment, the laser may have a wavelength selected from 1064-10600 nm and a power selected from 3-50 W. In another embodiment, the laser may have a wavelength of 1064 nm and a power selected from 3-40 W.

In another embodiment, the laser may have a wavelength of 1064 nm and a power selected from 5-20 W. The predetermined part of the ink layer may form a pattern, and the metal layer then formed on the predetermined part may form a metal pattern on the insulating substrate. By using the laser, the precision of the metal pattern may be improved.

In some embodiments, the irradiating step may be performed by using an electron beam, and the electron beam may have a power density selected from $10$-$10^{11}$ W/cm$^2$.

In some embodiments, the irradiating step may be performed by using an ion beam, and the ion beam may have an energy selected from $10$-$10^6$ eV.

In some embodiments, the insulating substrate may include at least one selected from a group including: plastic, rubber, fiber, coating layer, ceramic, glass, wood, cement, and paper. In some embodiments, the insulating substrate may be made of plastic or ceramic.

In some embodiments, the insulating substrate is made of flexible plastic, which may include but not limited to polyethylene terephthalate, polyimide, polycarbonate, poly (ether-ketone), poly(ether-ether-ketone), and liquid crystal. In such embodiments, the at least one metal layer formed on the insulating substrate can be used for various applications, such as for preparing flexible circuits.

It will be understood that the features mentioned above and those still to be explained hereinafter may be used not only in the particular combination specified but also in other combinations or on their own, without departing from the scope of the present invention.

Some illustrative and non-limiting examples are provided in the following for a better understanding of the embodiments of the present disclosure.

Tests

Samples of the metal compounds and the polymer articles obtained from the following Examples and Comparative Examples were subjected to the following tests.

Composition

In the following Examples and Comparative Examples, the composition of the metal compound was measured by an Inductively Coupled Plasma—Atomic Emission Spectrometry (ICP-AES).

Average Volume Diameter

In the following Examples and Comparative Examples, the average volume diameter of the particles of the metal compound (e.g., the doped tin oxide) was measured by a Laser Particle Sizer commercially available from Chengdu Jingxin Powder Analyse Instrument Co., Ltd., China.

Adhesion

In the following Examples and Comparative Examples, the adhesion between the metal layer and the base polymer was determined by a cross-cut process. Specifically, a surface of the sample to be measured was cut using a cross-cut knife to form a grid comprising 100 test regions (each region was 1 mm×1 mm), such that a gap between adjacent regions was formed to reach the bottom of the metal layer. Debris in a test region was cleaned using a brush, and then an adhesive tape (3M600 gummed paper) was attached to a tested region. One end of the attached adhesive paper was rapidly torn off in a vertical direction. Two identical tests were performed on the same grid region. The grade of the adhesion was determined according to the following standard:

Grade 5B: the cut edge is smooth and the metal layers both at the cut edge and cut intersection of the grid does not fall off;

Grade 4B: the metal layers at the cut intersection are partly removed, but no more than 5% (area percentage) of the metal layers are removed;

Grade 3B: the metal layers both at the cut edge and the cut intersection are partly removed, and 5-15% (area percentage) of the metal layers are removed;

Grade 2B: the metal layers at both the cut edge and the cut intersection are partly removed, and 15-35% (area percentage) of the metal layers are removed;

Grade 1B: the metal layers at both the cut edge and the cut intersection are partly removed, and 35-65% (area percentage) of the metal layers are removed;

Grade 0B: the metal layers at both the cut edge and the cut intersection are partly removed, and more than 65% (area percentage) of the metal layers are removed.

The results are shown in Table 1.

Notch Impact Strength

In the following Examples and Comparative Examples, the notch impact strength of the polymer article was measured according to ASTM D256. For each sample, 5 testing points were tested and 5 results were recorded, and the value of the notch impact strength was recorded as the average of the 5 results.

EXAMPLE 1

The present example included the following steps.

Step 1) Particles of tin oxide or $SnO_2$ were grinded in a grinding mill for 4 hours together with $V_2O_5$ and ethanol, to form a first mixture. Based on 100 weight parts of $SnO_2$ and $V_2O_5$, the amount of ethanol was 300 weight parts. Based on the total amount of $SnO_2$ and $V_2O_5$, the content of $V_2O_5$ was 10 mol %. The first mixture was dried under an air atmosphere at 80° C. for 2 hours, thus resulting in a powder mixture having particles with an average volume diameter of 1 μm. The powder mixture was calcined under an air atmosphere at 900° C. for 5 hours and grinded to white powders having particles with an average volume diameter of 1.5 μm, a second mixture. The composition test showed that the white powders included doped tin oxide with a content of $V_2O_5$ being 10 mol %.

Step 2) The white powders of doped tin oxide were mixed with polycarbonate (PC) to form a third mixture, and then the third mixture was extruded and pelleted with an extruder to form pellets. The pellets were injection molded in an injection mold, thus forming a PC sheet including the doped tin oxide. Based on the total weight of the doped tin oxide and the PC, the content of the doped tin oxide was 3 wt %. The PC sheet was subjected to the impact strength test described above, and the results were recorded in Table 1.

Step 3) A surface of the PC sheet was irradiated with a YAG laser to remove PC on a predetermined part (corresponding to the structure of a radio receiver circuit or an antenna circuit) of the surface of the PC sheet. The laser had a wavelength of 1064 nm, a power of 5 W, a frequency of 30 kHz, a scanning speed of 1000 mm/s, and a filling distance of 30 μm.

Step 4) The PC sheet irradiated with the laser was subjected to chemical plating by using a Cu solution, thus forming a metal layer on the predetermined part of the surface of the PC sheet. The metal layer formed may be used as an antenna. The Cu solution included 0.12 mol/L of $CuSO_4.5H_2O$, 0.14 mol/L of $Na_2EDTA.2H_2O$, 10 mg/L of potassium ferrocyanide, 10 mg/L of 2,2'-bipyridine, and 0.10 mol/L of glyoxylic acid. The Cu solution had a temperature of 50° C. and a pH of 12.5-13, which was adjusted with NaOH and $H_2SO_4$ solutions. Then the PC sheet formed with the metal layer was observed, and it was found that the metal layer formed a complete circuit on the PC sheet. The plating speed and adhesion between the metal layer and the PC were both listed in Table 1.

COMPARATIVE EXAMPLE 1

The present example included the following steps.

Step 1) Tin oxide was mixed with PC to form a mixture, and then the mixture was extruded and pelleted under the same conditions as described in the step 2) of Example 1, thus forming a PC sheet including tin oxide. Based on the total weight of the tin oxide and the PC, the content of the tin oxide was 3 wt %.

Step 2) The PC sheet obtained from the step 2) was irradiated with a laser under the same condition as described in step 3 of Example 1.

Step 3) The PC sheet irradiated with the laser was subjected to chemical plating under the same conditions as described in step 4 of Example 1. It was observed that, it was not capable of forming a complete metal circuit on the PC sheet.

COMPARATIVE EXAMPLE 2

The present example included the following steps.

Step 1) Tin oxide was mixed with PC to form a mixture, and then the mixture was extruded and pelleted under the same conditions as described in step 2 of Example 1, thus forming a PC sheet including tin oxide. Based on the total weight of the tin oxide and the PC, the content of the tin oxide was 10 wt %, i.e., 1.85 vol %. The PC sheet was subjected to an impact strength test, and the results were recorded in Table 1.

Step 2) The PC sheet was irradiated with a laser under the same conditions as described in the step 3) of Example 1.

Step 3) The PC sheet irradiated with the laser was subjected to chemical plating under the same conditions as described in step 4 of Example 1. It was observed that, a complete metal circuit was formed on the PC sheet. The plating speed and adhesion between the metal layer and the PC were both listed in Table 1.

EXAMPLE 2

The present example included the following steps.

Step 1) Particles of tin oxide or $SnO_2$ were grinded in a grinding mill for 2 hours together with $MoO_3$ and ethanol, to form a first mixture. Based on 100 weight parts of $SnO_2$ and $MoO_3$, the amount of ethanol was 300 weight parts. Based on the total amount of $SnO_2$ and $MoO_3$, the content of $MoO_3$ was 10 mol %. The first mixture was dried under an air atmosphere at 80° C. for 3 hours, thus resulting in a powder mixture having particles with an average volume diameter of 2.6 μm. The powder mixture was calcined under an air atmosphere at 950° C. for 5 hours and grinded to white powders having particles with an average volume diameter of 1.6 μm, a second mixture. The composition test showed that the white powders included doped tin oxide with a content of $MoO_3$ being 10 mol %.

Step 2) The white powders of doped tin oxide were mixed with PC to form a third mixture, and then the third mixture was extruded and pelleted with an extruder to form pellets. The pellets were injection molded in an injection mold, thus forming a PC sheet including the doped tin oxide. Based on the total weight of the doped tin oxide and the PC, the content of the doped tin oxide was 3 wt %. The PC sheet was subjected to the impact strength test described above, and the results were recorded in Table 1.

Step 3) A surface of the PC sheet was irradiated with a laser under the same conditions as described in step 3 of Example 1.

Step 4) The PC sheet irradiated with the laser was subjected to chemical plating under the same conditions as described in step 4 of Example 1. Then the PC sheet formed with the metal layer was observed, and it was found that the metal layer formed a complete circuit on the PC sheet. The plating speed and adhesion between the metal layer and the PC were both listed in Table 1.

COMPARATIVE EXAMPLE 3

The present example included substantially the same steps as those of Example 2, with the exception that: in step 1, the same amount of $Ga_2O_3$ was used instead of $MoO_3$. It was observed that, it was not capable of forming a complete metal circuit on the PC sheet.

EXAMPLE 3

The present example included the following steps.

Step 1) The step of preparing the doped tin oxide was substantially the same as step 1 of Example 2, with the exception that the amount of $MoO_3$ was 8 mol %. The composition test showed that the white powders included doped tin oxide with a content of $MoO_3$ being 8 mol %.

Step 2) The step of preparing the PC sheet was substantially the same as step 2 of Example 2, with the exception that the doped tin oxides was those obtained from step 1 of Example 3. The PC sheet was subjected to the impact strength test described above, and the results were recorded in Table 1.

Step 3) The step of irradiating the PC sheet was substantially the same as step 3 of Example 2, with the exception that the PC sheet was obtained from step 2 of Example 3.

Step 4) The step of chemical plating was substantially the same as step 4 of Example 2, with the exception that the PC sheet was obtained from step 3 of Example 3. The PC sheet formed with the metal layer was observed, and it was found that the metal layer formed a complete circuit on the PC sheet. The plating speed and adhesion between the metal layer and the PC were both listed in Table 1.

EXAMPLE 4

The present embodiment included the following steps.

Step 1) Particles of tin oxide or $SnO_2$ were grinded in a grinding mill for 5 hours together with $V_2O_5$ and ethanol, to form a first mixture. Based on 100 weight parts of $SnO_2$ and $V_2O_5$, the amount of ethanol was 300 weight parts. Based on the total amount of $SnO_2$ and $V_2O_5$, the content of $V_2O_5$ was 1 mol %. The first mixture was dried under an air atmosphere at 100° C. for 6 hours, thus resulting in a powder mixture having particles with an average volume diameter of 1.8 μm. The powder mixture was calcined under an air atmosphere at 850° C. for 6 hours and grinded to white powders having particles with an average volume diameter of 1.2 μm, a second mixture. The composition test showed that the white powders included doped tin oxide with a content of $V_2O_5$ being 1 mol %.

Step 2) The white powders of doped tin oxide were mixed with PC to form a third mixture, and then the third mixture was extruded and pelleted with an extruder to form pellets. The pellets were injection molded in an injection mold, thus forming a PC sheet including the doped tin oxide. Based on the total weight of the doped tin oxide and the PC, the content of the doped tin oxide was 3 wt %. The PC sheet was subjected to the impact strength test described above, and the results were recorded in Table 1.

Step 3) A surface of the PC sheet was irradiated with a YAG laser to remove PC on a predetermined part (corresponding to the structure of a radio receiver circuit or an antenna circuit) of the surface of the PC sheet. The laser had a wavelength of 1064 nm, a power of 20 W, a frequency of 30 kHz, a scanning speed of 800 mm/s, and a filling distance of 25 μm.

Step 4) The PC sheet irradiated with the laser was subjected to chemical plating under the same conditions as described in step 4 of Example 1. Then the PC sheet formed with the metal layer was observed, and it was found that the metal layer formed a complete circuit on the PC sheet. The plating speed and adhesion between the metal layer and the PC were both listed in Table 1.

EXAMPLE 5

The present example included the following steps.

Step 1) The step of preparing the doped tin oxide was substantially the same as step 1 of Example 4, with the exception that the amount of $V_2O_5$ was 2 mol %. The composition test showed that the white powders included doped tin oxide with a content of $V_2O_5$ being 2 mol %.

Step 2) The step of preparing the PC sheet was substantially the same as step 2 of Example 4, with the exception that the doped tin oxide was that obtained from step 1 of Example 5. The PC sheet was subjected to the impact strength test described above, and the results were recorded in Table 1.

Step 3) The step of irradiating the PC sheet was substantially the same as step 3 of Example 4, with the exception that the PC sheet was obtained from step 2 of Example 5.

Step 4) The step of chemical plating was substantially the same as step 4 of Example 4, with the exception that the PC sheet was obtained from step 3 of Example 5. The PC sheet formed with the metal layer was observed, and it was found that the metal layer formed a complete circuit on the PC sheet. The plating speed and adhesion between the metal layer and the PC were both listed in Table 1.

EXAMPLE 6

The present example included the following steps.

Step 1) Particles of $SnO_2$ were grinded in a grinding mill for 4 hours together with $MoO_3$, $V_2O_5$, and ethanol, to form a first mixture. Based on 100 weight parts of $SnO_2$, $MoO_3$, and $V_2O_5$, the amount of ethanol was 200 weight parts. Based on the total amount of $SnO_2$, $MoO_3$, and $V_2O_5$, the content of $MoO_3$ was 1.8 mol % and the content of $V_2O_5$ was 2.5 mol %. The first mixture was dried under an air atmosphere at 120° C. for 4 hours, thus resulting in a powder mixture having particles with an average volume diameter of 3.8 μm. The powder mixture was calcined under an air atmosphere at 920° C. for 4 hours and grinded to white powders having particles with an average volume diameter of 3.2 μm, a second mixture. The composition test showed that the white powders included doped tin oxide with a content of $MoO_3$ being 1.8 mol % and a content of $V_2O_5$ being 2.5 mol %.

Step 2) The white powders of doped tin oxide were mixed with PC together with particles of $TiO_2$ having an average volume diameter of 2.1 μm to form a third mixture, and then the third mixture was extruded and pelleted with an extruder to form pellets. The pellets were injection molded in an injection mold, thus forming a PC sheet including the doped tin oxide. Based on the total weight of the doped tin oxide, $TiO_2$, and the PC, the content of the doped tin oxide was 1.8 wt % and the content of the $TiO_2$ was 2 wt %. The PC sheet was subjected to the impact strength test described above, and the results were recorded in Table 1.

Step 3) The PC sheet was irradiated with a laser under the same conditions as described in step 3 of Example 1.

Step 4) The PC sheet irradiated with the laser was subjected to chemical plating under the same conditions as described in step 4 of Example 1. Then the PC sheet formed with the metal layer was observed, and it was found that the metal layer formed a complete circuit on the PC sheet. The plating speed and adhesion between the metal layer and the PC were both listed in Table 1.

EXAMPLE 7

The present example included substantially the same steps as those of Example 1, with the exception that in step 2, based on the total weight of the doped tin oxide and the PC, the content of the doped tin oxide was 5 wt %. It was found that the metal layer formed a complete circuit on the PC sheet. The plating speed and adhesion between the metal layer and the PC were both listed in Table 1.

TABLE 1

|  | Plating Speed (μm/h) | Adhesion | Impact Strength (J/m) |
|---|---|---|---|
| Example 1 | 5.1 | 5B | 673.8 |
| Comparative Example 1 | — | — | — |
| Comparative Example 2 | 6 | 5B | 483 |
| Example 2 | 5.2 | 5B | 650.2 |
| Comparative Example 3 | — | — | — |
| Example 3 | 5.1 | 5B | 649.3 |
| Example 4 | 2.7 | 3B | 676.4 |
| Example 5 | 4.5 | 4B | 679.3 |
| Example 6 | 4.7 | 5B | 642.3 |
| Example 7 | 5.6 | 5B | 548.4 |

EXAMPLE 8

The present example included the following steps.

Step 1) 100 g of the doped tin oxide obtained from step 1 of Example 1, 20 g binder CAB381-0.5 (commercially available from Eastman Chemical Company, US), 100 g n-ethanol, 2 g dispersing agent DISPERBYK-165 (commercially available from BYK Company, GE), 0.2 g antifoaming agent BYK-051 (commercially available from BYK Company, GE), 0.4 g leveling agent BYK-333 (commercially available from BYK Company, GE), and 0.5 g hydrogenated castor oil (commercially available from Wuhan Jinnuo Chemical Company, China) were mixed uniformly to obtain an ink composition.

Step 2) The ink composition was applied on a surface of an $Al_2O_3$ ceramic substrate by ink jet printing, and then the $Al_2O_3$ ceramic substrate applied with the ink composition was dried at a temperature of 120° C. for 3 hours. Thus an ink layer was formed on the surface of the ceramic substrate. The ink layer formed a predetermined pattern, corresponding to the structure of an antenna circuit for a radio receiver. The ink layer was tested with a scanning electron microscope, which showed that the ink layer had a thickness of 12 μm.

Step 3) The ink layer was irradiated with a laser, and the laser had a wavelength of 1064 nm, a power of 5 W, a frequency of 20 kHz, a moving speed of 800 mm/s, and a filling distance of 20 μm.

Step 4) The ceramic substrate with the irradiated ink layer was subjected to chemical plating using a Cu solution including 0.12 mol/L of $CuSO_4.5H_2O$, 0.14 mol/L of $Na_2EDTA.2H_2O$, 10 mg/L of potassium ferrocyanide, 10 mg/L of 2,2'-bipyridine, and 0.10 mol/L of glyoxylic acid. The Cu solution had a temperature of 50° C. and a pH of 12.5-13, which was adjusted with NaOH and $H_2SO_4$ solutions. Therefore a metal layer was formed on the ceramic substrate. Then the ceramic substrate was observed, and it was found that the metal layer formed a complete circuit on the ceramic substrate. The plating speed and adhesion between the metal layer and the ceramic substrate were both listed in Table 2.

EXAMPLE 9

The present example included substantially the same steps as those of Example 8, with the exception that step 3 was not performed, i.e., after the ink layer was applied on the surface of the ceramic substrate, the step of chemical plating was performed directly. The ceramic substrate was observed, and it was found that the metal layer formed a complete circuit on the ceramic substrate. The plating speed and adhesion between the metal layer and the ceramic substrate were both listed in Table 2.

COMPARATIVE EXAMPLE 4

The present example included substantially the same steps as those of Example 8, with the exception that a tin oxide was used instead of the doped tin oxide. The ceramic substrate was observed, and it was found that the metal layer was not capable of forming a complete circuit on the ceramic substrate.

EXAMPLE 10

The present example included the following steps.
Step 1) 50 g of doped tin oxide obtained from step 1 of Example 2, 15 g of polyvinyl butyral Serial No. Mowital (commercially available from Kuraray Company, JP), and 20 g of toluene were mixed uniformly to obtain an ink composition.
Step 2) The ink composition was applied on a surface of a poly(ether-ether-ketone) (PEEK) substrate, and then the PEEK substrate applied with the ink composition was dried at a temperature of 150° C. for 4 hours. Thus an ink layer was formed on the surface of the ceramic substrate. The ink layer formed a predetermined pattern, corresponding to the structure of an antenna circuit for a radio receiver. The ink layer was tested with a scanning electron microscope, and it showed that the ink layer had a thickness of 25 μm.
Step 3) The ink layer was irradiated with a laser, and the laser had a wavelength of 1064 nm, a power of 5 W, a frequency of 20 kHz, a moving speed of 1000 mm/s, and a filling distance of 20 μm.
Step 4) The ceramic substrate with the irradiated ink layer was subjected to chemical plating using a Cu solution including 0.12 mol/L of $CuSO_4.5H_2O$, 0.14 mol/L of $Na_2EDTA.2H_2O$, 10 mg/L of potassium ferrocyanide, 10 mg/L of 2,2'-bipyridine, and 0.10 mol/L of glyoxylic acid. The Cu solution had a temperature of 50° C. and a pH of 12.5-13, which was adjusted with NaOH and $H_2SO_4$ solutions. Therefore a metal layer having a thickness of 4 μm was formed on the ceramic substrate. Then the ceramic substrate was observed, and it was found that the metal layer formed a complete circuit on the ceramic substrate. The plating speed and adhesion between the metal layer and the ceramic substrate were both listed in Table 2.

EXAMPLE 11

The present example included substantially the same steps as those of Example 10, with the exception that the doped tin oxide was obtained from step 1 of Example 3. The ceramic substrate was observed, and it was found that the metal layer formed a complete circuit on the ceramic substrate. The plating speed and adhesion between the metal layer and the ceramic substrate were both listed in Table 2.

EXAMPLE 12

The present example included the following steps.
Step 1) 100 g of doped tin oxide obtained from step 1 of Example 1, 30 g of EVA binder (commercially available from Eastman Chemical Company, US), 110 g toluene, 3 g dispersing agent ANTI-TERRA-U 80 (commercially available from BYK Company, GE), 0.5 g antifoaming agent BYK-065 (commercially available from BYK Company, GE), 0.5 g leveling agent BYK-306 (commercially available from BYK Company, GE), and 0.4 g hydroxyethyl cellulose (commercially available from Luzhou North Cellulose Co., Ltd., China) were mixed uniformly to obtain an ink composition.
Step 2) The ink composition was applied on a surface of a glass substrate, and then the glass substrate applied with the ink composition was dried at a temperature of 150° C. for 4 hours. Thus an ink layer was formed on the surface of the glass substrate. The ink layer formed a predetermined pattern, corresponding to the structure of an antenna circuit for a radio receiver. The ink layer was tested with a scanning electron microscope, and it showed that the ink layer had a thickness of 18 μm.
Step 3) The ink layer was irradiated with a laser under the same conditions as those in step 3 of Example 10.
Step 4) The glass substrate with the irradiated ink layer was subjected to chemical plating using a Cu solution including 0.12 mol/L of $CuSO_4.5H_2O$, 0.14 mol/L of $Na_2EDTA.2H_2O$, 10 mg/L of potassium ferrocyanide, 10 mg/L of 2,2'-bipyridine, and 0.10 mol/L of glyoxylic acid. The Cu solution had a temperature of 50° C. and a pH of 12.5-13, which was adjusted with NaOH and $H_2SO_4$ solutions. Therefore a metal layer was formed on the glass substrate. Then the glass substrate was observed, and it was found that the metal layer formed a complete circuit on the glass substrate. The plating speed and adhesion between the metal layer and the glass substrate were both listed in Table 2.

EXAMPLE 13

The present example included substantially the same steps as those of Example 12, with the exception that the doped tin oxide was obtained from step 1) of Example 5. The glass substrate was observed, and it was found that the metal layer formed a complete circuit on the glass substrate. The plating speed and adhesion between the metal layer and the glass substrate were both listed in Table 2.

TABLE 2

| | Plating Speed (μm/h) | Adhesion |
|---|---|---|
| Embodiment 8 | 12 | 5B |
| Comparative Embodiment 4 | — | — |
| Embodiment 9 | 8 | 3B |
| Embodiment 10 | 11 | 5B |
| Embodiment 11 | 10.8 | 5B |
| Embodiment 12 | 9.2 | 4B |
| Embodiment 13 | 10 | 4B |

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles, and scope of the present disclosure.

What is claimed is:

1. A polymer article, comprising:
   a base polymer; and
   at least one metal compound dispersed in the base polymer, wherein the metal compound comprises the doped tin oxide comprising:
   a tin oxide, and
   at least one oxide of a doping element,
   wherein the doping element comprises molybdenum, and
   an amount of the tin oxide ranges from 90 mol % to 99 mol % and an amount of the at least one oxide ranges from 1 mol % to 10 mol %.

2. The polymer article according to claim 1, wherein the doped tin oxide comprises oxide particles having an average volume diameter ranging from 50 nm to 10 μm.

3. The polymer article according to claim 1, further comprising an amount of the metal compound ranging from 1 wt % to 3 wt %, and an amount of the base polymer ranging from 97 wt % to 99 wt %.

* * * * *